United States Patent
Sagara

(10) Patent No.: US 12,038,602 B2
(45) Date of Patent: Jul. 16, 2024

(54) OPTICAL CIRCUIT SUBSTRATE

(71) Applicant: KYOCERA Corporation, Kyoto (JP)

(72) Inventor: Akifumi Sagara, Moriyama (JP)

(73) Assignee: KYOCERA Corporation, Kyoto (JP)

( * ) Notice: Subject to any disclaimer, the term of this patent is extended or adjusted under 35 U.S.C. 154(b) by 356 days.

(21) Appl. No.: 17/439,558

(22) PCT Filed: Dec. 17, 2019

(86) PCT No.: PCT/JP2019/049295
§ 371 (c)(1),
(2) Date: Sep. 15, 2021

(87) PCT Pub. No.: WO2020/188922
PCT Pub. Date: Sep. 24, 2020

(65) Prior Publication Data
US 2022/0155518 A1    May 19, 2022

(30) Foreign Application Priority Data

Mar. 15, 2019 (JP) ................................. 2019-048624

(51) Int. Cl.
*G02B 6/122* (2006.01)
*G02B 6/42* (2006.01)
*H05K 1/11* (2006.01)

(52) U.S. Cl.
CPC ........... *G02B 6/122* (2013.01); *G02B 6/4214* (2013.01); *H05K 1/11* (2013.01)

(58) Field of Classification Search
CPC .................. G02B 6/122; G02B 6/4214; G02B 2006/12104; H05K 1/11; H05K 1/0274; H05K 2201/2054
See application file for complete search history.

(56) References Cited

U.S. PATENT DOCUMENTS 8,634,683 B2 * 1/2014 Yanagisawa ......... G02B 6/4214
385/129
2011/0286692 A1   11/2011 Yanagisawa

FOREIGN PATENT DOCUMENTS

| JP | 05-241044 A | 9/1993 |
| JP | 2004-354664 A | 12/2001 |
| JP | 2011-209510 A | 10/2011 |
| JP | 2011-242706 A | 12/2011 |

* cited by examiner

*Primary Examiner* — John Bedtelyon
(74) *Attorney, Agent, or Firm* — Volpe Koenig

(57) ABSTRACT

An optical circuit substrate according to the present disclosure includes a wiring board and an optical waveguide. The optical waveguide includes a core layer, cladding layers formed on both main surfaces of the core layer, and a reflective mirror portion that passes through the cladding layers and the core layer, and is provided on the wiring board via a conductor layer located on a surface of the wiring board. When the optical waveguide is viewed in a cross section in a thickness direction, the reflective mirror portion has a recessed portion in at least a part of the cladding layer on the conductor layer side.

4 Claims, 2 Drawing Sheets

OPTICAL CIRCUIT SUBSTRATE

TECHNICAL FIELD

The present disclosure relates to an optical circuit substrate.

BACKGROUND ART

In recent years, optical communication networks capable of communicating large amounts of data at high speed have expanded, and various optical communication devices utilizing such optical communication networks exist. Such devices are equipped with an optical circuit substrate in which an optical waveguide is connected to a substrate as described in Patent Document 1, for example.

CITATION LIST

Patent Literature

Patent Document 1: JP 05-241044 A

SUMMARY OF INVENTION

An optical circuit substrate according to the present disclosure includes a wiring board and an optical waveguide. The optical waveguide includes a core layer, cladding layers formed on both main surfaces of the core layer, and a reflective mirror portion that passes through the cladding layers and the core layer, and is provided on the wiring board via a conductor layer located on a surface of the wiring board. When the optical waveguide is viewed in a cross section in a thickness direction, the reflective mirror portion has a recessed portion in at least a part of one of the cladding layers on the conductor layer side.

DESCRIPTION OF EMBODIMENTS

In an optical circuit substrate, an optical waveguide may be connected on a conductor layer formed on a surface of a wiring board. In this case, the conductor layer formed on the wiring board and a cladding layer formed in the optical waveguide are in contact with each other. The conductor layer is formed of a metal having a small thermal expansion coefficient, while the cladding layer is formed of a resin or the like having a larger thermal expansion coefficient than that of the metal. Therefore, due to the difference in thermal expansion, peeling is likely to occur between the conductor layer and the cladding layer. As a result, the stability and reliability of the optical circuit substrate are reduced.

In a wiring board according to the present disclosure, when an optical waveguide is viewed in a cross section in a thickness direction, a reflective mirror portion has a recessed portion in at least a part of a cladding layer on the side of a conductor layer. Therefore, even when the difference in thermal expansion between the conductor layer and the cladding layer is relatively large, stress generated at a boundary between the conductor layer and the cladding layer is likely to be dispersed by the recessed portion. As a result, peeling is unlikely to occur between the conductor layer and the cladding layer, and the stability and reliability of the optical circuit substrate can be improved.

Figure 1:
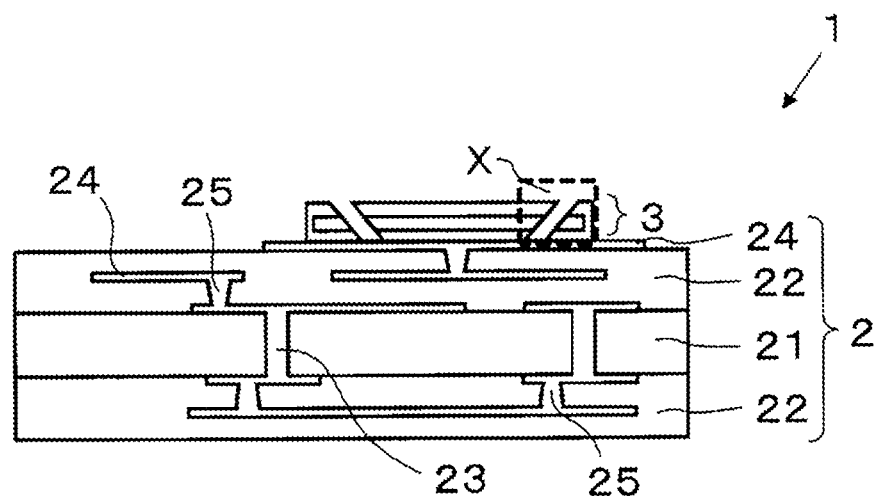
FIG. 1 is a schematic view illustrating a cross section of an optical circuit substrate according to an embodiment of the present disclosure.

An optical circuit substrate according to an embodiment of the present disclosure will be described with reference to FIGS. 1 and 2. An optical circuit substrate 1 according to the embodiment illustrated in FIG. 1 includes a wiring board 2 and an optical waveguide 3. The wiring board 2 includes a core substrate 21 and build-up layers 22 layered on both surfaces of the core substrate 21. The core substrate 21 is not particularly limited as long as the core substrate 21 is formed of a material having an insulating property. Examples of the material having an insulating property include resins such as an epoxy resin, a bismaleimide-triazine resin, a polyimide resin, and a polyphenylene ether resin. Two or more of these resins may be mixed and used. The thickness of the core substrate 21 is not particularly limited and is, for example, 100 µm or more and 2000 µm or less.

The core substrate 21 may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. Further, an inorganic insulating filler made of, for example, silica, barium sulfate, talc, clay, glass, calcium carbonate, or titanium oxide may be dispersed in the core substrate 21.

A through hole conductor 23 is formed in the core substrate 21 to electrically connect the upper and lower surfaces of the core substrate 21. The through hole conductor 23 is formed in a hole passing through the upper and lower surfaces of the core substrate 21. The through hole conductor 23 is formed of a conductor made of metal plating such as copper plating, for example. The through hole conductor 23 is connected to conductor layers 24 formed on both surfaces of the core substrate 21. A land (not illustrated) may be one of the formed conductor layers 24. The through hole conductor 23 may be formed only on an inner wall surface of the hole formed in the core substrate 21, or may fill the hole formed in the core substrate 21.

The build-up layers 22 are layered on both surfaces of the core substrate 21. Although the structure of the build-up layer 22 is not illustrated in detail in the wiring board 1 illustrated in FIG. 1, it is sufficient that the build-up layer 22 has a structure in which at least one insulating layer and one conductor layer 24 are alternately layered.

As with the core substrate 21, the insulating layer included in the build-up layer 22 is not particularly limited as long as the insulating layer is formed of a material having an insulating property. Examples of the material having an insulating property include resins such as an epoxy resin, a bismaleimide-triazine resin, a polyimide resin, and a polyphenylene ether resin. Two or more of these resins may be mixed and used. When two or more insulating layers are present in the build-up layer 22, the respective insulating layers may be formed of the same resin or may be formed of different resins. The insulating layers included in the build-up layer 22 and the core substrate 21 may be formed of the same resin or may be formed of different resins.

Further, an inorganic insulating filler made of, for example, silica, barium sulfate, talc, clay, glass, calcium carbonate, or titanium oxide may be dispersed in the insulating layer included in the build-up layer 22. The thickness of the insulating layer included in the build-up layer 22 is not particularly limited and is, for example, 5 µm or more and 100 µm or less. When two or more insulating layers are present in the build-up layer 22, the respective insulating layers may have the same thickness or may have different thicknesses.

A via hole conductor 25 for electrically connecting the layers is formed in the insulating layer included in the build-up layer 22. The via hole conductor 25 is formed in a hole passing through the upper and lower surfaces of the insulating layer included in the build-up layer 22. The via hole conductor 25 is formed of a conductor made of metal plating such as copper plating, for example. The via hole conductor 25 is connected to the conductor layers 24 formed on both surfaces of the insulating layer included in the build-up layer 22. A land (not illustrated) may be one of the formed conductor layers 24. The via hole conductor 25 may be formed only on an inner wall surface of the hole formed in the insulating layer included in the build-up layer 22, or may fill the hole formed in the insulating layer included in the build-up layer 22.

The optical waveguide 3 is provided on an upper surface of the wiring board 2 via the conductor layer 24 formed on the surface of the wiring board 2 (the surface of the build-up layer 22). As illustrated in FIG. 2, the optical waveguide 3 includes a core layer 31, cladding layers 32, and a reflective mirror portion 33.

The core layer 31 included in the optical waveguide 3 acts as an optical path, and light entering the optical waveguide 3 passes through the core layer 31. The material forming the core layer 31 is not limited, and is appropriately set in consideration of, for example, permeability to light, wavelength characteristics of light passing through the core layer 31, and the like. Examples of the material include an epoxy resin and a silicone resin. The core layer 31 may have a thickness of, for example, 20 µm or more and 40 µm or less.

The cladding layers 32 included in the optical waveguide 3 are formed on both main surfaces of the core layer 31. In the optical waveguide 3 illustrated in FIG. 2, the cladding layer 32 on the conductor layer 24 side is a lower cladding layer 32a, and the other cladding layer 32 is an upper cladding layer 32b. The material forming the cladding layer 32 is not limited, and examples thereof include an epoxy resin and a silicone resin. The cladding layer 32 may have a thickness of, for example, 5 µm or more and 60 µm or less, and the lower cladding layer 32a and the upper cladding layer 32b may have the same thickness or may have different thicknesses.

The reflective mirror portion 33 included in the optical waveguide 3 is formed so as to pass through the upper cladding layer 32b, the core layer 31, and the lower cladding layer 32a in the thickness direction. The reflective mirror portion 33 is not formed parallel to the thickness direction of the optical waveguide 3, but is formed so as to be inclined with respect to the thickness direction. The inclination angle is appropriately set in accordance with the thickness of the optical waveguide 3, a device on which the optical circuit substrate 1 is mounted, and the like. The angle formed by the core layer 31 and the reflective mirror portion 33 is, for example, approximately 40° or more and 50° or less.

The shape of an opening portion of the reflective mirror portion 33, that is, the shape when the reflective mirror portion 33 is viewed in plan view from the upper cladding layer 32b is not particularly limited. For example, the opening portion of the reflective mirror portion 33 may have a polygonal shape such as a triangular shape, a quadrilateral shape, a pentagonal shape, or a hexagonal shape (the polygonal shape includes a polygonal shape in which each vertex is rounded), a circular shape, an elliptical (oval) shape, or the like. In order to sufficiently ensure a region for forming a via conductor and the like around the reflective mirror portion 33, the opening portion of the reflective mirror portion 33 may have a triangular shape (the triangular shape includes a triangular shape in which each vertex is rounded).

When the optical waveguide is viewed in a cross section in the thickness direction, the reflective mirror portion 33 has a recessed portion 34 in at least a part of the cladding layer 32 on the conductor layer 24 side (lower cladding layer 32a). The thickness direction is a direction extending from an upper surface of the upper cladding layer 32b to a lower surface of the lower cladding layer 32a. The recessed portion 34 is formed such that at least a part of the lower cladding layer 32a is recessed from the reflective mirror portion 33 in a horizontal plane direction. The horizontal plane direction is a direction parallel to the upper surface of the conductor layer 24. When the recessed portion 34 is located on the side where an angle formed by an inner wall surface of the reflective mirror portion 33 and the conductor layer 24 is an acute angle as illustrated in FIG. 2, it is advantageous in that peeling is unlikely to occur at an interface between the conductor layer 24 and the lower cladding layer 32a. In other words, when stress is applied to the optical waveguide 3, the peeling can be reduced due to the recessed portion 34 being located at a portion that is likely to be a starting point of peeling at a boundary between the conductor layer 24 and the lower cladding layer 32a.

The size of the recessed portion 34 is not limited, and for example, the length of the recessed portion 34 in the horizontal plane direction may be approximately 5 µm or more and 15 µm or less. The length of the recessed portion 34 in the horizontal plane direction refers to the length from the reflective mirror portion 33 to the deepest portion of the recessed portion 34 when the recessed portion 34 is viewed from the reflective mirror portion 33 side, and corresponds to L1 illustrated in FIG. 3A. The length of the recessed portion 34 in the thickness direction may be approximately 3 µm or more and 10 µm or less. The length of the recessed portion 34 in the thickness direction refers to the length of the widest portion when the recessed portion 34 is viewed from the reflective mirror portion 33 side, and corresponds to L2 illustrated in FIG. 3A. When L1 is larger than L2, θ illustrated in FIG. 3A becomes smaller, which is advantageous in that peeling is unlikely to occur at the interface between the conductor layer 24 and the lower cladding layer 32a.

Figure 2:
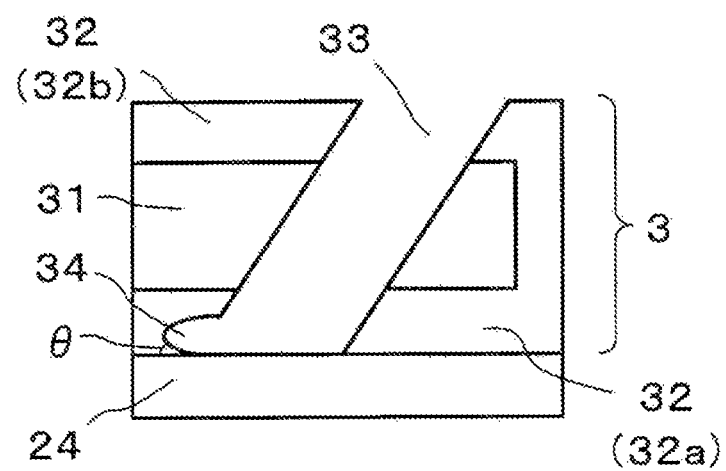
FIG. 2 is an enlarged explanatory view of a region X in the optical circuit substrate illustrated in FIG. 1.

In FIG. 2, the recessed portion 34 has a curved portion when the optical waveguide 3 is viewed in a cross section in the thickness direction. Since the recessed portion 34 has the curved portion, the stress generated at the boundary between the conductor layer 24 and the lower cladding layer 32a can be further dispersed. As a result, peeling is less likely to occur at the interface between the conductor layer 24 and the lower cladding layer 32a. Further, an opening portion of the recessed portion 34 is in contact with the conductor layer 24. At this contact portion, the angle θ formed by the conductor layer 24 and the lower cladding layer 32a is an acute angle when the optical waveguide 3 is viewed in a cross section in the thickness direction. By making the angle θ an acute angle, it is unlikely to be a starting point of peeling at the boundary between the conductor layer 24 and the lower cladding layer 32a.

A method of forming the recessed portion 34 as formed in the optical waveguide 3 is not limited and the recessed portion 34 is formed, for example, as follows. First, the conductor layer 24 is formed on the surface of the wiring board 2 (the surface of the build-up layer 22). Subsequently, a laminate (precursor of the optical waveguide) of the core layer 31 and the cladding layer 32, which is the material of the optical waveguide 3, is connected to the upper surface of the conductor layer 24. Subsequently, the reflective mirror portion 33 is formed in the laminate. The reflective mirror portion 33 is formed by, for example, laser machining. The energy of the laser is increased slightly more than usual, specifically, the energy of the laser is increased so that the laser is reflected by the conductor layer 24 and does not damage the conductor layer 24, thereby forming the reflective mirror portion 33. By machining with the energy of the laser slightly stronger than usual in this way, the laser reflected by the conductor layer 24 erodes the lower cladding layer 32a to form the recessed portion 34.

The optical circuit substrate of the present disclosure is not limited to the embodiment described above. For example, in the optical circuit substrate 1 described above, as illustrated in FIG. 3A, the opening portion of the recessed portion 34 is in contact with the conductor layer 24. However, the opening portion of the recessed portion need not necessarily be in contact with the conductor layer as illustrated in FIGS. 3B and 3C.

Figure 3A:
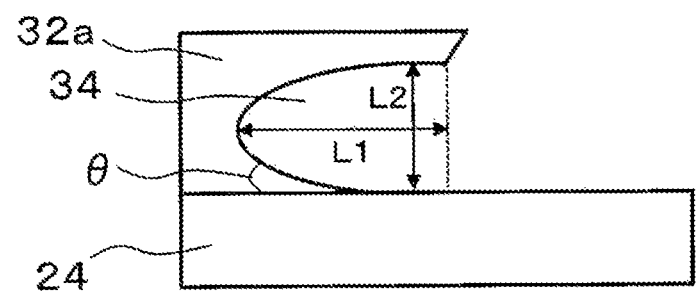
FIGS. 3A to 3C are schematic views illustrating various shapes of recessed portions formed in the reflective mirror portion.
Figure 3B:
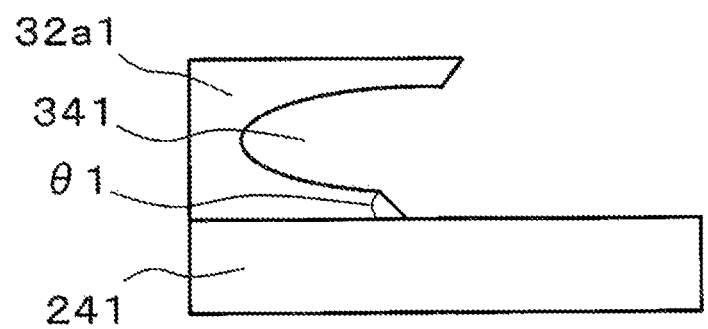

In FIG. 3B, although the opening portion of a recessed portion 341 is not in contact with a conductor layer 241, an angle θ1 formed by a lower cladding layer 32a1 and the conductor layer 241 is an acute angle when the optical waveguide is viewed in a cross section in the thickness direction. When the angle θ1 is an acute angle, as described above, it is unlikely to be a starting point of peeling at a boundary between the conductor layer 241 and the lower cladding layer 32a1.

Figure 3C:
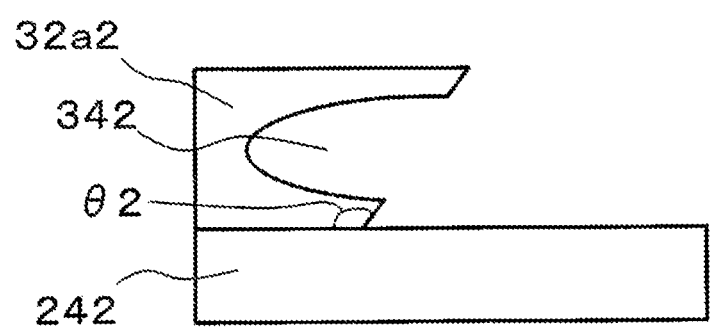

On the other hand, in FIG. 3C, the opening portion of a recessed portion 342 is not in contact with a conductor layer 242, and an angle θ2 formed by a lower cladding layer 32a2 and the conductor layer 242 is an obtuse angle when the optical waveguide is viewed in a cross section in the thickness direction. Although the angle θ2 is an obtuse angle, the recessed portion 342 has a curved portion when the optical waveguide is viewed in a cross section in the thickness direction. Since the recessed portion 342 has a curved portion, stress generated at a boundary between the conductor layer 242 and the lower cladding layer 32a2 can be further dispersed as described above. As a result, peeling is less likely to occur at the interface between the conductor layer 242 and the lower cladding layer 32a2.

The recessed portions 34, 341, and 342 illustrated in FIGS. 3A to 3C each have a curved portion when the optical waveguide is viewed in a cross section in the thickness direction. However, the recessed portion need not necessarily have a curved portion. The recessed portion may have a structure other than a curved portion as long as at least a part of the lower cladding layer is recessed from the reflective mirror portion in the horizontal plane direction. In the optical circuit substrate of the present disclosure, stress generated at the boundary between the conductor layer and the lower cladding layer can be dispersed by providing the recessed portion.

REFERENCE SIGNS LIST

1 Optical circuit substrate
2 Wiring board
21 Core substrate
22 Build-up layer
23 Through hole conductor
24, 241, 242 Conductor layer
25 Via hole conductor
3 Optical waveguide
31 Core layer
32 Cladding layer
32a, 32a1, 32a2 Lower cladding layer
32b Upper cladding layer
33 Reflective mirror portion
34, 341, 342 Recessed portion

The invention claimed is:

1. An optical circuit substrate comprising:
a wiring board; and
an optical waveguide, wherein
the optical waveguide comprises a core layer, cladding layers formed on both main surfaces of the core layer, and a reflective mirror portion that passes through the cladding layers and the core layer, and is provided on the wiring board via a conductor layer located on a surface of the wiring board, and
when the optical waveguide is viewed in a cross section in a thickness direction, the reflective mirror portion has a recessed portion recessed and curved in a horizontal plane direction in at least a part of one of the cladding layers on a side of the conductor layer.

2. The optical circuit substrate according to claim 1, wherein
when the optical waveguide is viewed in the cross section, the recessed portion is located below a portion in which a lower surface of the core layer and a wall surface of the reflective mirror portion form an obtuse angle.

3. The optical circuit substrate according to claim 1, wherein
an opening portion of the recessed portion is in contact with a contact portion of the conductor layer, and an angle formed by the conductor layer and the one of the cladding layers at the contact portion is an acute angle when viewed in the cross section.

4. The optical circuit substrate according to claim 1, wherein
when viewed in the cross section, a length of the recessed portion in the horizontal plane direction is larger than a length in the thickness direction.

* * * * *